(12) United States Patent
Huang

(10) Patent No.: US 6,831,410 B2
(45) Date of Patent: Dec. 14, 2004

(54) ORGANIC LIGHT-EMITTING DEVICE AND FABRICATING METHOD THEREOF

(75) Inventor: Wei-Pang Huang, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 63 days.

(21) Appl. No.: 10/250,008

(22) Filed: May 28, 2003

(65) Prior Publication Data

US 2004/0189192 A1 Sep. 30, 2004

(30) Foreign Application Priority Data

Mar. 27, 2003 (TW) .......................................... 92106901

(51) Int. Cl.$^7$ ................................................. H01J 1/62
(52) U.S. Cl. ........................ 313/506; 313/504; 313/505
(58) Field of Search ................................. 313/498, 504, 313/505, 506, 509, 512

(56) References Cited

U.S. PATENT DOCUMENTS

2003/0146696 A1 * 8/2003 Park et al. ................... 313/506

* cited by examiner

Primary Examiner—Vip Patel
(74) Attorney, Agent, or Firm—Jiang Chyun IP Office

(57) ABSTRACT

An active matrix organic light-emitting device and fabricating method thereof is provided. A switching device is formed over a substrate and then an insulating layer is formed over the substrate to cover the switching device. Thereafter, a contact opening is formed in the insulating layer to expose a portion of the switching device. An anode layer is formed over the insulating layer and the exposed surface of the contact opening. A planarization layer is formed in the contact opening. A light-emitting layer is formed over the anode layer and the planarization layer. Finally, a cathode layer is formed over the light-emitting layer. By forming a planarization layer inside the contact opening, the chance of having an electrical short-circuit between the anode layer and the cathode layer is minimized.

11 Claims, 1 Drawing Sheet

ORGANIC LIGHT-EMITTING DEVICE AND FABRICATING METHOD THEREOF

CROSS REFERENCE TO RELATED APPLICATIONS

This application claims the priority benefit of Taiwan application serial no. 92106901, filed Mar. 27, 2003.

BACKGROUND OF INVENTION

1. Field of Invention

The present invention relates to a light-emitting device and fabricating method thereof. More particularly, the present invention relates to an active matrix organic light-emitting device and fabricating method thereof.

2. Description of Related Art

An organic light-emitting device is a highly efficient semiconductor for converting electrical energy into photonic energy. The organic light-emitting device is commonly used as an indicator light, a display panel and an optical read/write head. Due to the special properties possessed by an organic light-emitting device including no viewing angle restriction, easy to manufacture, low production cost, high response speed, large operating temperature range and full colorization, the organic light-emitting device has been used as a display in many multi-media systems.

At present, the active matrix type of organic light-emitting device is being actively researched. An active matrix organic light-emitting device comprises an organic light-emitting layer and a cathode layer formed over a substrate having an array of thin film transistor thereon. The thin film transistors are the principal drivers for driving an active matrix light-emitting display device.

FIG. 1 is a schematic cross-sectional view of a conventional active matrix organic light-emitting device. To form the active matrix organic light-emitting device as shown in FIG. 1, a thin film transistor 130 is formed over a substrate 100. The thin film transistor 130 comprises a gate 102, a channel layer 106, an ohmic contact layer 108 and source/drain terminals 110a/110b. The gate 102 and the channel layer 106 are isolated from each other through a gate insulation layer 104.

Thereafter, an insulating layer 112 is formed over the substrate 100 covering the thin film transistor 130. A contact opening 114 is formed in the insulating layer 112. The contact opening 114 exposes the drain terminal 110b of the thin film transistor 130. An anode layer 116 is formed over the insulating layer 112 and the exposed opening 114. Finally, a light-emitting layer 118 is formed over the anode layer 116 and then a cathode layer 120 is formed over the light-emitting layer 118.

In the aforementioned method of fabricating the active matrix organic light-emitting device, it is difficult to form a light emitting layer 118 having an ideal coverage at the junction with the contact opening 114. Consequently, after the cathode layer 120 is formed over the light-emitting layer 118, the cathode layer 120 may form a short circuit with the anode layer 116 via the contact opening 114 leading to the production of dark lines on the display device and a shortening of its working life.

Moreover, the poor coverage of the light-emitting layer 118 is due to the formation of a large inverted angle at the junction between the anode layer 116 and the contact opening 114. Hence, the subsequent deposition of material over the anode layer 116 to form the light-emitting layer 118 is incomplete.

SUMMARY OF INVENTION

Accordingly, one object of the present invention is to provide an active matrix organic light-emitting device and fabricating method thereof that prevents a possible short-circuit between an anode layer and an cathode layer at a contact opening inside the device.

A second object of this invention is to provide an active matrix organic light-emitting device and fabricating method thereof that amends the problem of having an incompletely deposited light-emitting layer due to a large inverted angle at the junction between an anode and a contact opening inside the device.

To achieve these and other advantages and in accordance with the purpose of the invention, as embodied and broadly described herein, the invention provides a method of fabricating an active matrix organic light-emitting device. First, a switching device is formed on a substrate. The switching device is, for example, a thin film transistor comprising a gate, a channel layer formed over the gate, an ohmic contact layer formed over the channel layer and a source/drain region terminal formed over the ohmic contact layer. The gate and the channel layer are isolated from each other through a gate insulation layer. Thereafter, an insulating layer is formed over the substrate covering the thin film transistor. A contact opening is formed in the insulating layer to expose the drain terminal of the thin film transistor. An anode layer is formed over the insulating layer and the exposed contact opening. Next, a planarization layer is formed inside the contact opening. The planarization layer is formed, for example, by coating an organic photosensitive material layer over the anode layer globally and then performing a photolithographic process to pattern the organic photosensitive material layer. Hence, an organic photosensitive material layer is retained inside the contact opening to form the planarization layer. Finally, a light-emitting layer is formed over the anode layer and the planarization layer and then a cathode layer is formed over the light-emitting layer so that a complete active matrix organic light-emitting device is formed.

This invention also provides an active matrix organic light-emitting device. The active matrix organic light-emitting device comprises a switching device, an insulating layer, a contact, an anode layer, a planarization layer, a light-emitting layer and a cathode layer. The switching device is formed on a substrate. The switching device is, for example, a thin film transistor comprising a gate, a channel layer formed over the gate, an ohmic contact layer formed over the channel layer and a source/drain terminal formed over the ohmic contact layer. The gate and the channel layer are isolated from each other through a gate insulation layer. The insulating layer is formed over the substrate covering the thin film transistor. The contact is set up within the insulating layer. The contact is electrically connected to the drain terminal of the thin film transistor. The anode layer is formed over the insulating layer and is electrically connected to the contact. The planarization layer completely fills the space above the contact. The planarization layer is fabricated using an organic photosensitive material. The light-emitting layer is formed over the anode layer and the planarization layer. Furthermore, the cathode layer is formed over the light-emitting layer.

In this invention, organic photosensitive material is deposited into the contact opening to form the planarization layer after the anode layer is formed. Hence, the incomplete deposition of the light-emitting material is avoided. In other words, a possible short circuit between the anode layer and the cathode layer at the junction with the contact opening is prevented.

Furthermore, organic photosensitive material is deposited into the contact opening to form the planarization layer. Hence, an etching process is no longer needed. This reduces the risk of damaging the surface of the anode layer.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION

Figure 1:
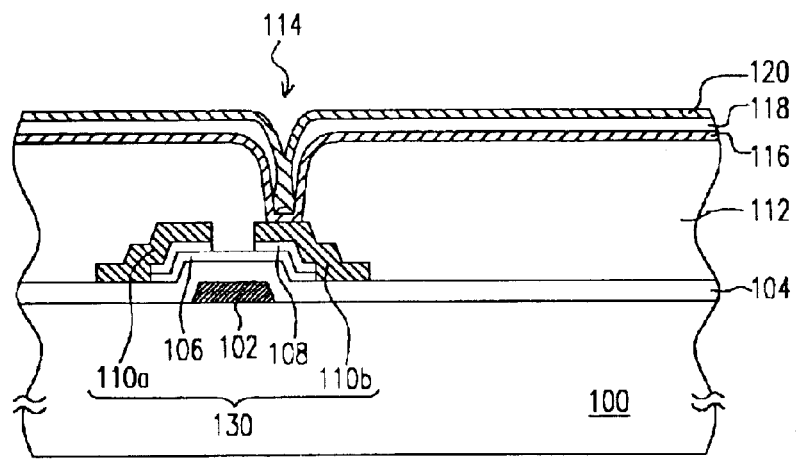
FIG. 1 is a schematic cross-sectional view of a conventional active matrix organic light-emitting device.

Reference will now be made in detail to the present preferred embodiments of the invention, examples of which are illustrated in the accompanying drawings. Wherever possible, the same reference numbers are used in the drawings and the description to refer to the same or like parts.

Figure 2:
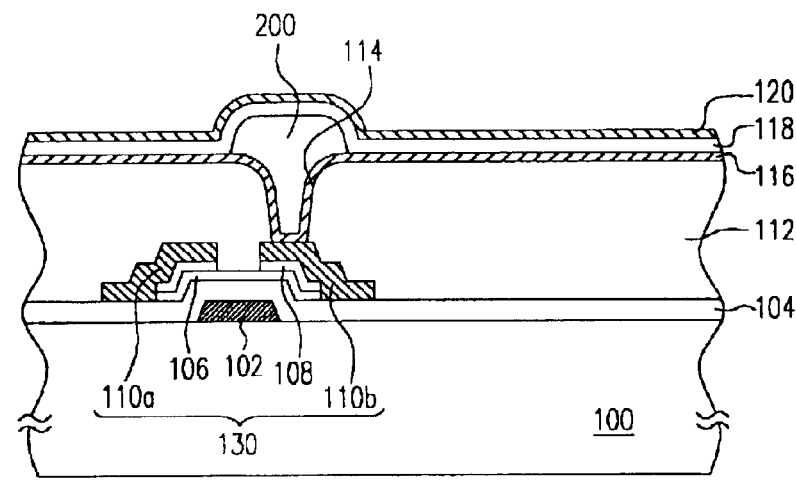
FIG. 2 is a schematic cross-sectional view of an active matrix organic light-emitting device according to one preferred embodiment of this invention.

FIG. 2 is a schematic cross-sectional view of an active matrix organic light-emitting device according to one preferred embodiment of this invention. To fabricate the active matrix organic light-emitting device as shown in FIG. 2, a substrate 100 such as a glass substrate or a plastic substrate is provided. Thereafter, a switching device 130 is formed over the substrate 100.

In one preferred embodiment of this invention, the switching device 130 is a thin film transistor comprising a gate 102 formed over the substrate 100, a channel layer 106 formed over the gate 102, an ohmic contact layer 108 formed over the channel layer 106 and source/drain terminals 110a/110b formed over the ohmic contact layer 108. Furthermore, after forming the gate 102, the gate insulation layer 104 is formed before forming the channel layer 106 over the gate insulation layer 104.

Thereafter, an insulating layer 112 is formed over the substrate 100 to cover the thin film transistor 130. In one preferred embodiment of this invention, the insulating layer 112 is fabricated using an organic photosensitive material. The insulating layer 112 is formed, for example, by performing a spin coating process to form an insulating layer over the substrate 100 globally. Since the insulating layer 112 is formed using a spin-coating process, the insulation layer 112 has a planar upper surface so that a subsequently formed anode layer over the insulation layer 112 can have a reduced surface roughness level.

A contact opening 114 is formed in the insulating layer 112. The contact opening 114 exposes the drain terminal 110b of the thin film transistor 130. Thereafter, an anode layer 116 is formed over the insulating layer 112 and the exposed surface of the contact opening 114. The anode layer 116 is fabricated using a material including, for example, indium-tin oxide or indium-zinc oxide. The anode layer 116 is formed, for example, by performing a sputtering process.

Because the insulating layer 112 is formed in a spin-coating process, the insulating layer 112 has a planar upper surface. Hence, the anode layer 116 over the insulating layer 112 also has a reduced roughness level.

After forming the anode layer 116, a planarization layer 200 is formed inside the contact opening 114. The planarization layer 200 is fabricated using an organic photosensitive material, for example. The planarization layer 200 is formed, for example, by forming an organic photosensitive material layer (not shown) over the anode layer 112 and filling the contact opening 114 in a spin-coating process and then carrying out a photolithographic process to pattern the organic photosensitive material layer. Ultimately, a block of organic photosensitive material is retained inside the contact opening 114.

Thereafter, a light-emitting layer 118 is formed over the anode layer 116 and the planarization layer 200. The light-emitting layer 118 is fabricated using a material including, for example, an organic light-emitting material or a high molecular weight light-emitting material. Finally, a cathode layer 120 is formed over the light-emitting layer 118 to form a complete active matrix organic light-emitting device.

In this invention, organic photosensitive material is deposited into the contact opening 114 to form the planarization layer 200 after the anode layer is formed so that the planarization layer 200 has a rather gentle side slopes. Hence, the formation of an incompletely deposited light-emitting layer 118 over the anode layer 116 is prevented. Furthermore, with the deposition of organic photosensitive material into the contact opening to form the planarization layer 200, etching is no longer needed. This reduces the risk of damaging the surface of the anode layer 116.

As shown in FIG. 2, the active matrix organic light-emitting device of this invention comprises a switching device 130, an insulating layer 112, a contact 114, an anode layer 116, a planarization layer 200, a light-emitting layer 118 and a cathode layer 120. The switching device 130 is formed over a substrate 100. The switching device 130 is, for example, a thin film transistor comprising a gate 102, a channel layer 102 formed over the gate 102, an ohmic contact layer 108 formed over the channel layer 106 and source/drain terminals 110a/110b formed over the ohmic contact layer 108. The gate 102 and the channel layer 106 are isolated from each other through a gate insulation layer 104. The gate insulation layer 112 is formed over the substrate 100 to cover the thin film transistor 130. The contact 114 is formed within the insulating layer 112 and is electrically connected to the drain terminal 110b of the thin film transistor 130. In addition, the anode layer 116 is formed over the insulating layer 112 and is electrically connected to the contact 114. The planarization layer 200 completely fills the space above the contact 114 so that the contact 114 has a flat upper surface. The planarization layer 200 is fabricated using an organic photosensitive material, for example. The light-emitting layer 118 is formed over the anode layer 116 and the planarization layer 200 and the cathode layer 120 is formed over the light-emitting layer 118.

In summary, this invention includes the following advantages: 1. An organic photosensitive material is deposited into the contact opening to form a planarization layer after the anode layer is formed. Hence, there is no incomplete deposition of the light-emitting material when the light-emitting material is deposited over the anode layer and the planarization layer. Ultimately, a possible short circuit between the anode layer and the cathode layer at the junction with the contact opening is prevented. 2. Since photosensitive material is deposited into the contact opening to form the planarization layer, an etching process is no longer needed. This reduces the risk of damaging the surface of the anode layer.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An active matrix organic light-emitting device, comprising:

a substrate;

a switching device formed on the substrate;

an insulating layer formed on the substrate covering the switching device;

a contact formed within the insulating layer, wherein the contact and the switching device are electrically connected;

an anode layer formed over the insulating layer, wherein the anode layer and the contact are electrically connected;

a planarization layer filling the space above the contact and having a flat upper surface;

a light-emitting layer formed over the anode layer and the planarization layer; and a cathode layer formed over the light-emitting layer.

2. The organic light-emitting device of claim 1, wherein the planarization layer comprises an organic photosensitive material layer.

3. The organic light-emitting device of claim 1, wherein the switching device comprises a thin film transistor.

4. The organic light-emitting device of claim 1, wherein the insulating layer has a flat upper surface.

5. The organic light-emitting device of claim 1, wherein the insulating layer comprises an organic photosensitive material layer.

6. A method of forming an active matrix organic light-emitting device, comprising the steps of:

forming a switching device over a substrate;

forming an insulating layer over the substrate to cover the switching device;

forming a contact opening in the insulating layer to expose a portion of the switching device;

forming an anode layer over the insulating layer and the exposed surface of the contact opening;

forming a planarization layer in the contact opening;

forming a light-emitting layer over the anode layer and the planarization layer; and forming a cathode layer over the light-emitting layer.

7. The method of claim 6, wherein the planarization layer comprises an organic photosensitive material layer.

8. The method of claim 6, wherein the step of forming a planarization layer in the contact opening comprises:

coating organic photosensitive material over the anode layer; and performing a photolithographic process to pattern the organic photosensitive material layer so that a portion of the organic photosensitive material layer is retained inside the contact opening.

9. The method of claim 6, wherein the switching device comprises a thin film transistor.

10. The method of claim 6, wherein the insulating layer has a flat upper surface.

11. The method of claim 6, wherein the insulating layer comprises an organic photosensitive material layer.

* * * * *